(12) United States Patent
Shirahama

(10) Patent No.: US 6,614,679 B2
(45) Date of Patent: Sep. 2, 2003

(54) SEMICONDUCTOR MEMORY DEVICE

(75) Inventor: Masanori Shirahama, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/112,025

(22) Filed: Mar. 29, 2002

(65) Prior Publication Data

US 2002/0149961 A1 Oct. 17, 2002

(30) Foreign Application Priority Data

Apr. 13, 2001 (JP) ........................................ 2001-115866

(51) Int. Cl.[7] ............................................... G11C 11/24
(52) U.S. Cl. ........................ 365/149; 365/205; 365/207
(58) Field of Search ................................ 365/149, 205, 365/207

(56) References Cited

U.S. PATENT DOCUMENTS

| | | |
|---|---|---|
| 5,596,543 A | 1/1997 | Sakui et al. |
| 5,754,481 A * | 5/1998 | Yabe et al. ............ 365/189.01 |
| 5,856,940 A | 1/1999 | Rao |
| 6,201,728 B1 | 3/2001 | Narui et al. |
| 6,359,825 B1 * | 3/2002 | Aimoto et al. ............... 365/149 |

FOREIGN PATENT DOCUMENTS

| | | |
|---|---|---|
| JP | 63-244877 | 10/1988 |
| JP | 2-226581 | 9/1990 |
| JP | 4-47585 | 2/1992 |
| JP | 2001-35159 | 2/2001 |

* cited by examiner

*Primary Examiner*—Huan Hoang
(74) *Attorney, Agent, or Firm*—Merchant & Gould P.C.

(57) ABSTRACT

A DRAM is provided that can reduce the time required for completion of a writing operation on a memory cell so as to speed up a random access cycle. The DRAM includes a sense amplifier driving circuit and a sense amplifier starting signal generation circuit. The sense amplifier starting signal generation circuit changes the timing of a starting signal based on an externally input signal so that the sense amplifier driving circuit activates a driving signal to a sense amplifier at an earlier time for writing than for reading. Write data are transferred to a bit line before the driving signal is activated. Thus, the bit line has a sufficient voltage for writing in the early stages, so that a sufficient charge can be transferred to a storage capacitor in a short time.

8 Claims, 11 Drawing Sheets

SEMICONDUCTOR MEMORY DEVICE

BACKGROUND OF THE INVENTION

1. Field of the Invention

The present invention relates to a semiconductor memory device including a dynamic random access memory (DRAM). In particular, the present invention relates to a technique for increasing the speed of the DRAM.

2. Description of the Related Art

The following is an explanation of a "low latency DRAM cell" such as that disclosed in U.S. Pat. No. 5,856,940. The low latency DRAM cell employs a dual word line and dual bit line system, in which each memory cell (2T/1C memory cell) includes two transistors (2T) and a storage capacitor (1C) and is connected to two word lines and two bit lines.

FIG. 1 is a diagram showing the circuit structure of a memory cell used in a conventional semiconductor memory device including the low latency DRAM cells. In FIG. 1, a memory cell 100 includes a first switching transistor 102, a second switching transistor 103, and a storage capacitor 104.

The first switching transistor 102 has a gate connected to a first word line WL0A, a drain connected to a first bit line BL0A, and a source connected to a storage node 101. The second switching transistor 103 has a gate connected to a second word line WL0B, a drain connected to a second bit line BL0B, and a source connected to the storage node 101. The storage capacitor 104 has two electrodes: one is connected to the storage node 101 and the other acts as a cell plate (CP).

As described above, the memory cell 100 includes the first and second switching transistors 102, 103, which can be controlled independently with respect to the storage capacitor 104. Therefore, it is possible to interleave the first word line WL0A and the first bit line BL0A with the second word line WL0B and the second bit line BL0B in a plurality of memory cells 100, thereby enabling high-speed reading and writing operations.

The minimum random cycle time for memory cell 100 is defined as a period of time needed to perform reading and writing operations reliably. For the reading operation, charge that has been stored in the storage capacitor 104 is rewritten by a sense amplifier (not shown), so that the operation is completed at high speed. For the writing operation, however, when data that is opposite logically to the charge stored in the storage capacitor 104 is written, the time required for charging becomes longer. Thus, the writing operation takes more time to be completed than the reading operation, which in turn increases the random access cycle time. This is a problem in providing a high-speed DRAM.

SUMMARY OF THE INVENTION

Therefore, with the foregoing in mind, it is an object of the present invention to provide a semiconductor memory device that can reduce the time required for completion of a writing operation on a 2T/1C or 1T/1C memory cell so as to speed up a random access cycle.

To achieve the above object, a semiconductor memory device according to the present invention includes the following: a memory cell for retaining data by storing charge in a storage capacitor; a bit line that is connected selectively to the memory cell by activation of a word line; a sense amplifier connected to the bit line; and a sense amplifier driving circuit for generating a driving signal to drive the sense amplifier. The sense amplifier driving circuit activates the driving signal with timing that differs in writing and reading, and write data is transferred to the bit line before activating the driving signal in writing.

In this semiconductor memory device, it is preferable that the sense amplifier driving circuit generates the driving signal at an earlier time for writing than for reading.

According to the above configuration, the sense amplifier starts amplification early in writing as compared with reading. Therefore, the bit line has a sufficient voltage for writing in the early stages, so that a sufficient charge can be transferred to the storage capacitor in a short time. This makes it possible to reduce the time required for writing and to increase the operating speed of the semiconductor memory device.

It is preferable that the semiconductor memory device of the present invention further includes a sense amplifier starting signal generation circuit for generating a sense amplifier starting signal at an earlier time for writing than for reading, and the sense amplifier driving circuit operates in response to the sense amplifier starting signal.

This configuration makes it possible to implement the present invention by only adjusting the timing in the sense amplifier starting signal generation circuit.

In the semiconductor memory device of the present invention, it is preferable that the sense amplifier driving circuit includes a transistor that activates the driving signal in accordance with a decode signal only in writing.

This configuration enables precise control that changes timing for starting amplification by the sense amplifier in accordance with the decode signal.

In the semiconductor memory device of the present invention, it is preferable that the sense amplifier driving circuit generates the driving signal before a selected word line is activated in writing.

According to this configuration, a period of time to activate the word line can be used sufficiently for writing on a memory cell, which leads to a further increase in the operating speed of the semiconductor memory device.

In the semiconductor memory device of the present invention, it is preferable that the device includes a plurality of sense amplifier driving circuits, each of which generates a driving signal in accordance with a decode signal in writing, and the driving signal that corresponds to a memory cell to be written is generated at an earlier time than that for reading, while the driving signal that corresponds to a memory cell to be refreshed is generated at the same time as that for reading.

According to this configuration, even if there is a memory cell to be refreshed in memory cells to be written, the high-speed writing of the present invention can be performed on the memory cells to be written while performing a refreshing operation.

In the semiconductor memory device of the present invention, it is preferable that the driving signal that corresponds to the memory cell to be written is generated before a selected word line is activated for writing.

According to this configuration, a period of time to activate the word line can be used sufficiently for writing on a memory cell, which leads to a further increase in the operating speed of the semiconductor memory device.

In the semiconductor memory device of the present invention, it is preferable that a wire is provided in the boundary region between the memory cell to be written and that to be refreshed in writing, the wire having a fixed potential and extending in the bit line direction.

This configuration can suppress the influence of noise that is caused during amplification of the bit line connected to the memory cell to be written upon the bit line connected to the memory cell to be refreshed.

In the semiconductor memory device of the present invention, it is preferable that the memory cell is a 2T/1C memory cell including two switching transistors, each of which is connected to the storage capacitor at one end.

This configuration can perform an interleaving operation between the two switching transistors, which leads to a further increase in the operating speed of the semiconductor memory device.

DESCRIPTION OF THE PREFERRED EMBODIMENTS

Hereinafter, a preferred embodiment of the present invention will be described with reference to the accompanying drawings.

Figure 4:
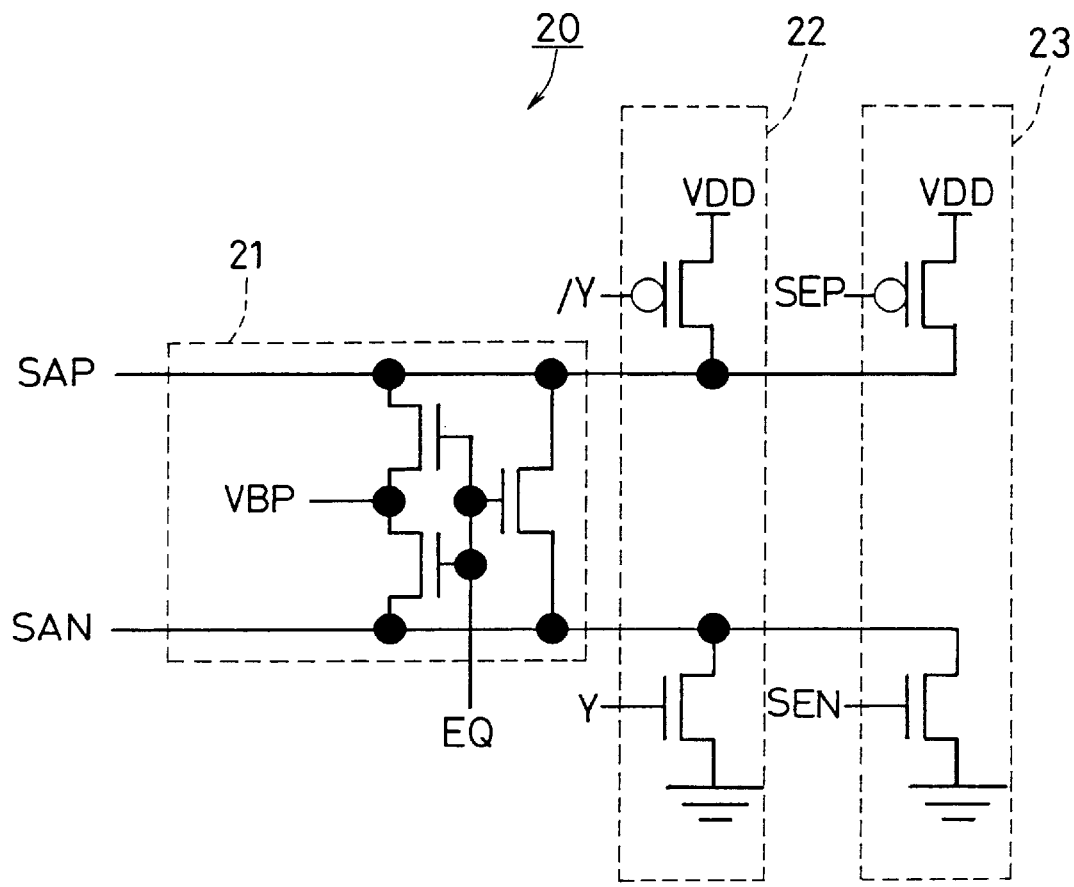
FIG. 4 is a circuit diagram showing the configuration of a sense amplifier driving circuit 20.

FIG. 4 is a circuit diagram showing the configuration of a sense amplifier driving circuit according to an embodiment of the present invention.

In FIG. 4, a sense amplifier driving circuit 20 includes an equalizing circuit 21, a first driver 22 for writing, and a second driver 23 for reading or refreshing. With this configuration, the sense amplifier driving circuit 20 can change timing for starting a sense amplifier in writing and reading or recharging by sense amplifier driving signals SAP and SAN.

Before starting the sense amplifier, the equalizing circuit 21 performs equalizing and pre-charging to a certain potential VBP. The first driver 22 receives a decode signal Y and its inverse signal /Y that are generated based on an external address input and write command, and then provides the sense amplifier driving signals SAN and SAP to the sense amplifier. The second driver 23 receives signals SEP and SEN that are generated later than Y and /Y, and then provides the sense amplifier driving signals SAN and SAP to the sense amplifier.

When access is designated by an external input, an equalize signal EQ that instructs the equalizing of an array of sense amplifiers transits from a logic High level to a logic Low level. The signal Y and its inverse signal /Y, which are decoded by a simultaneously input address, make transitions from logic Low to High levels and from logic High to Low levels, respectively. Then, the sense amplifier driving signal SAN transits from the equalized potential VBP to a logic Low level and SAP transits from the VBP to a logic High level, thus starting the sense amplifier.

When the semiconductor memory device receives the instructions for reading or refreshing instead of writing from the outside, the transitions of the decode signal Y and its inverse signal /Y do not occur, and the second driver 23 activates the sense amplifier by the signals SEN and SEP, which are generated later than the signals Y and /Y. Therefore, the sense amplifier can start rapidly in writing data only to the designated address.

Figure 5:
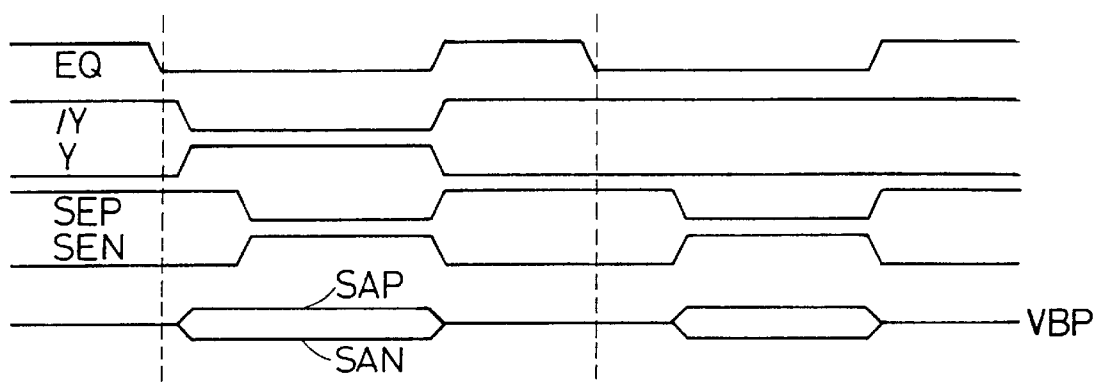
FIG. 5 is a timing chart of signals in the sense amplifier driving circuit 20 in FIG. 4.

FIG. 5 is a timing chart showing a change in the sense amplifier driving signals SAN, SAP according to the equalize signal EQ, the decode signals Y, /Y, and the signals SEN, SEP that are generated based on a sense amplifier starting signal in the sense amplifier driving circuit 20.

In FIG. 5, when the equalize signal EQ, which is generated based on an externally input address signal, transits from a logic High level to a Low level, the equalizing circuit 21 completes equalizing, so that the sense amplifier driving signals SAN, SAP are in a high-impedance state. The decode signals Y and /Y, which are generated based on an externally input write command and its address, make transitions from logic Low to High levels and from logic High to Low levels, respectively. The first driver 22 causes the sense amplifier driving signal SAN to transit from the equalized potential VBP to a logic Low level and SAP to transit from the VBP to a logic High level in accordance with the transitions of the decode signals Y, /Y. This allows the sense amplifier to perform a latching operation, and then the second driver 23 for reading or refreshing accelerates amplification by the sense amplifier with the signals SEN, SEP that are activated after the latching operation.

After writing, the equalize signal EQ transits to the logic High level and then to the logic Low level again due to decoding caused by access in reading or refreshing. For reading and refreshing, the transitions of the decode signals Y, /Y do not occur, so that the first driver 22 does not operate. Therefore, the sense amplifier driving signals SAN and SAP transit from the equalized potential VBP to a logic Low level and to a logic High level, respectively, by the signals SEP and SEN that are generated after a predetermined time delay.

As the signals to be applied to the sense amplifier driver, signals generated by delaying the decode signals Y, /Y can be used instead of these signals.

Figure 6:
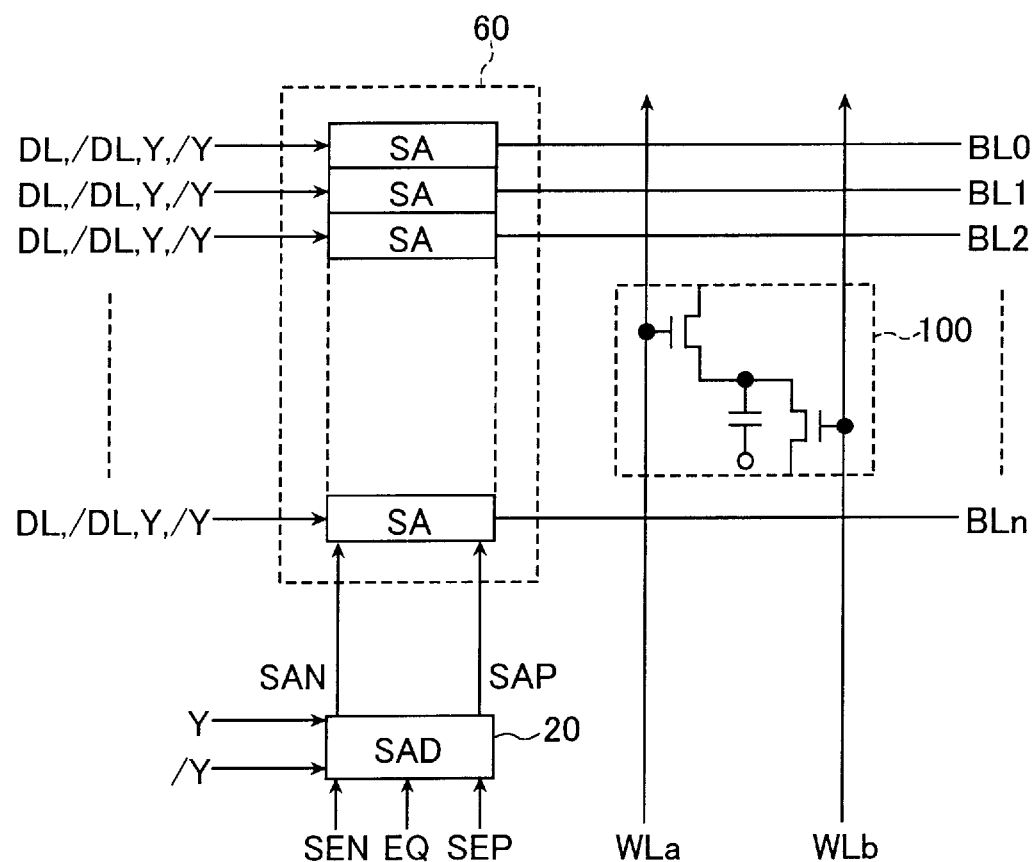
FIG. 6 is a diagram showing the configuration of a memory cell array group including a sense amplifier array 60 that is driven by the sense amplifier driving circuit 20 in FIG. 4.

FIG. 6 is a diagram showing the configuration of a memory cell array group including a sense amplifier array that is driven by the sense amplifier driving circuit (SAD) 20 in FIG. 4.

In FIG. 6, a sense amplifier array 60 is driven by the sense amplifier driving signals SAN, SAP from the single sense amplifier driving circuit 20. According to the operation illustrated in FIG. 4, the sense amplifier driving circuit 20 uses the first driver 22 that has received the decode signals Y, /Y for writing to provide the sense amplifier driving signals SAN, SAP. Therefore, when designated for writing, the sense amplifier array 60 is activated at an earlier time than that for reading or refreshing so as to start the writing operation. Thus, the speed for writing can be increased. Write data DL, /DL are transferred to bit lines BL0, /BL0 to BLn, and /BLn in accordance with the decode signals Y, /Y. In this case, a delay between the generation of the decode signals and the data transfer is adjusted so that the sense amplifier driving signals SAN, SAP are activated after the data have been transferred to the bit lines.

Figure 7:
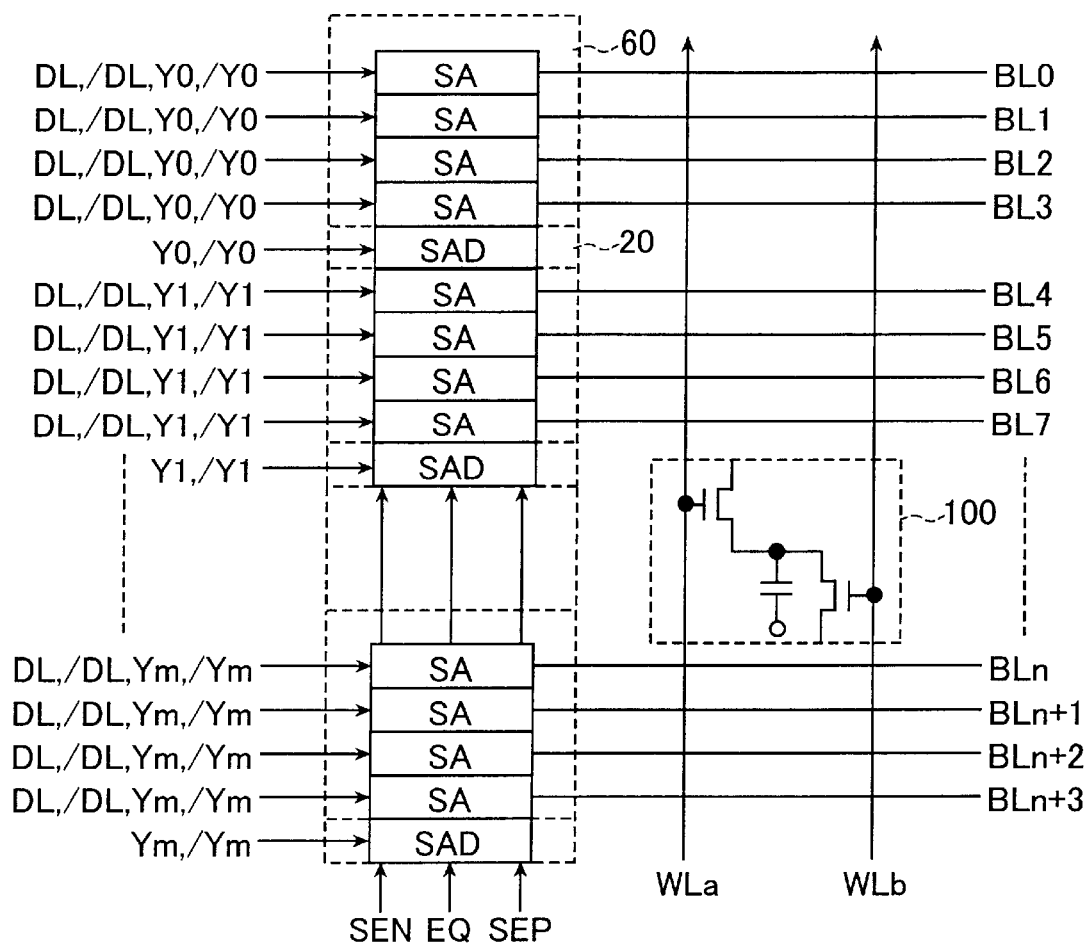
FIG. 7 is a diagram showing the configuration of a semiconductor memory device where a plurality of blocks are arranged, each including the sense amplifier array 60 in FIG. 6 and the sense amplifier driving circuit 20 in FIG. 4.

FIG. 7 is a diagram showing the configuration of a semiconductor memory device where a plurality of blocks are arranged, each including the sense amplifier array 60 in FIG. 6 and the sense amplifier driving circuit 20 in FIG. 4.

When the configuration shown in FIG. 7 is applied to a large capacity semiconductor memory device that requires a plurality of decoding operations for writing, the device can perform predetermined refresh and reading operations at the same time as a high speed writing operation.

Figure 8:
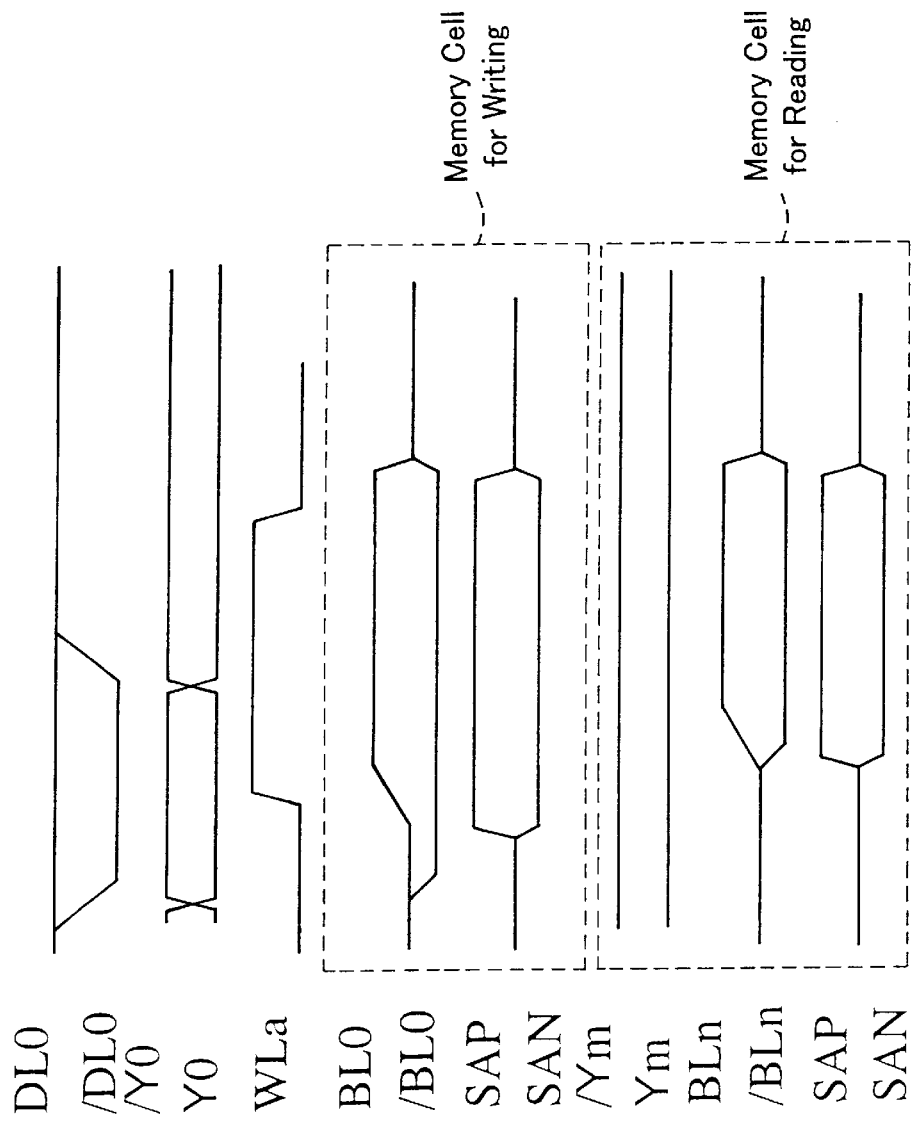
FIG. 8 is a timing chart of signals in the semiconductor memory device in FIG. 7.

FIG. 8 is a timing chart of signals for each portion in the semiconductor memory device in FIG. 7.

In FIG. 8, a decode address Y0 is designated for writing so that write data DL0, /DL0 are transferred to bit lines BL0, /BL0. Then, the sense amplifier driving signals SAN, SAP are supplied to a sense amplifier by the decode addresses Y0, /Y0, and thus the sense amplifier amplifies data on the bit lines. Thereafter, a selected word line WLa is activated and transits to a logic High level. On the other hand, a bit line BLn is not designated for writing. Since an address decode signal Ym makes no transition, the sense amplifier driving signals SAN, SAP are generated with existing timing to perform only a normal refreshing operation.

Figure 9:
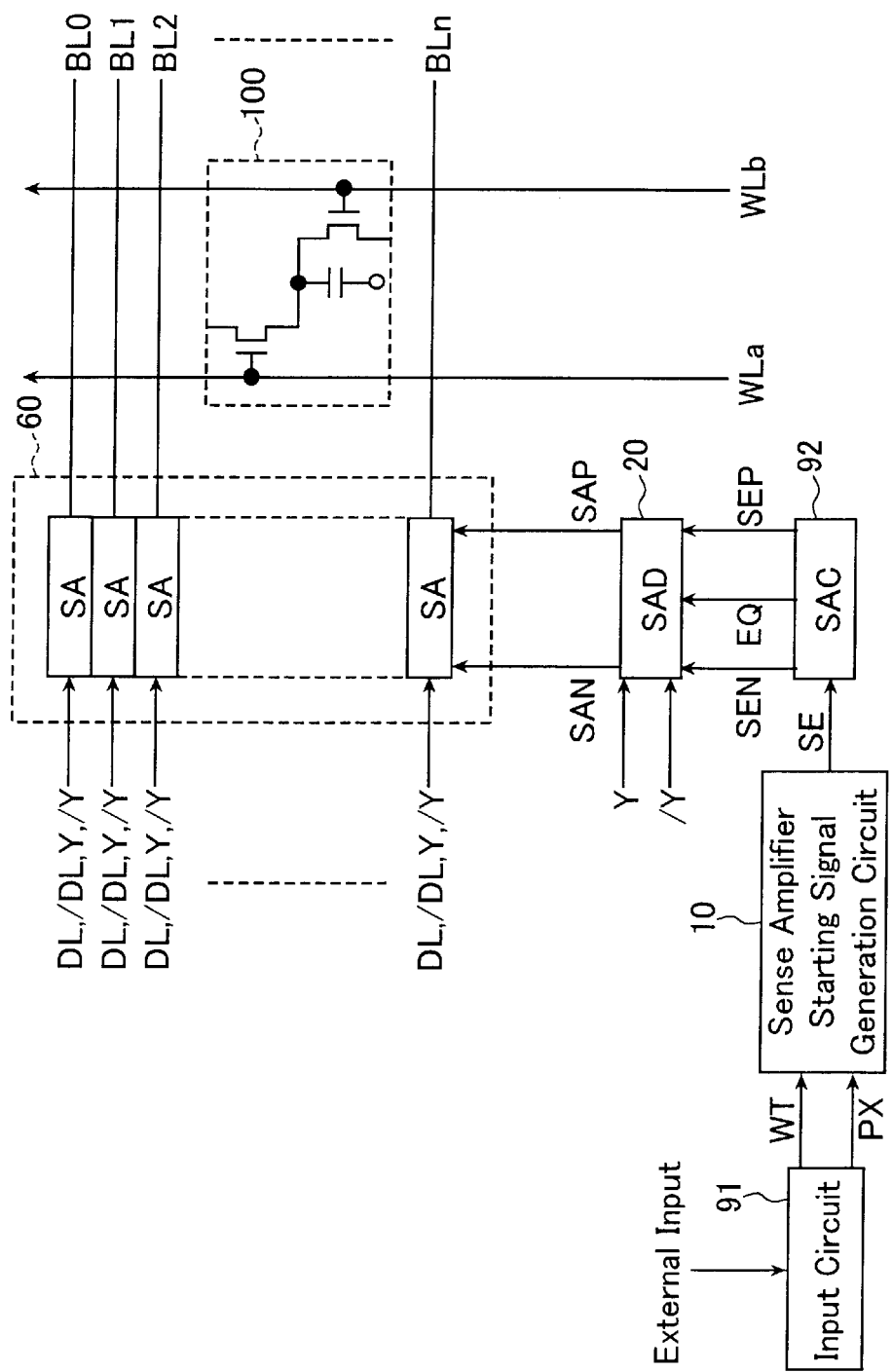
FIG. 9 is a diagram showing the configuration of a semiconductor memory device including the sense amplifier starting signal generation circuit 10 in FIG. 2.

FIG. 9 is a diagram showing an example of the configuration of a semiconductor memory device where the entire memory cell array is rewritten.

In FIG. 9, the semiconductor memory device includes an input circuit 91 and a sense amplifier control circuit (SAC) 92, in addition to a sense amplifier starting signal generation circuit 10, a sense amplifier driving circuit 20, and a sense amplifier array 60. The input circuit 91 generates a pre-decode signal PX and a write command signal WT based on an externally input signal. The sense amplifier control circuit 92 receives a sense amplifier starting signal SE and outputs signals SEP, SEN to the sense amplifier driving circuit 20.

Figure 1:
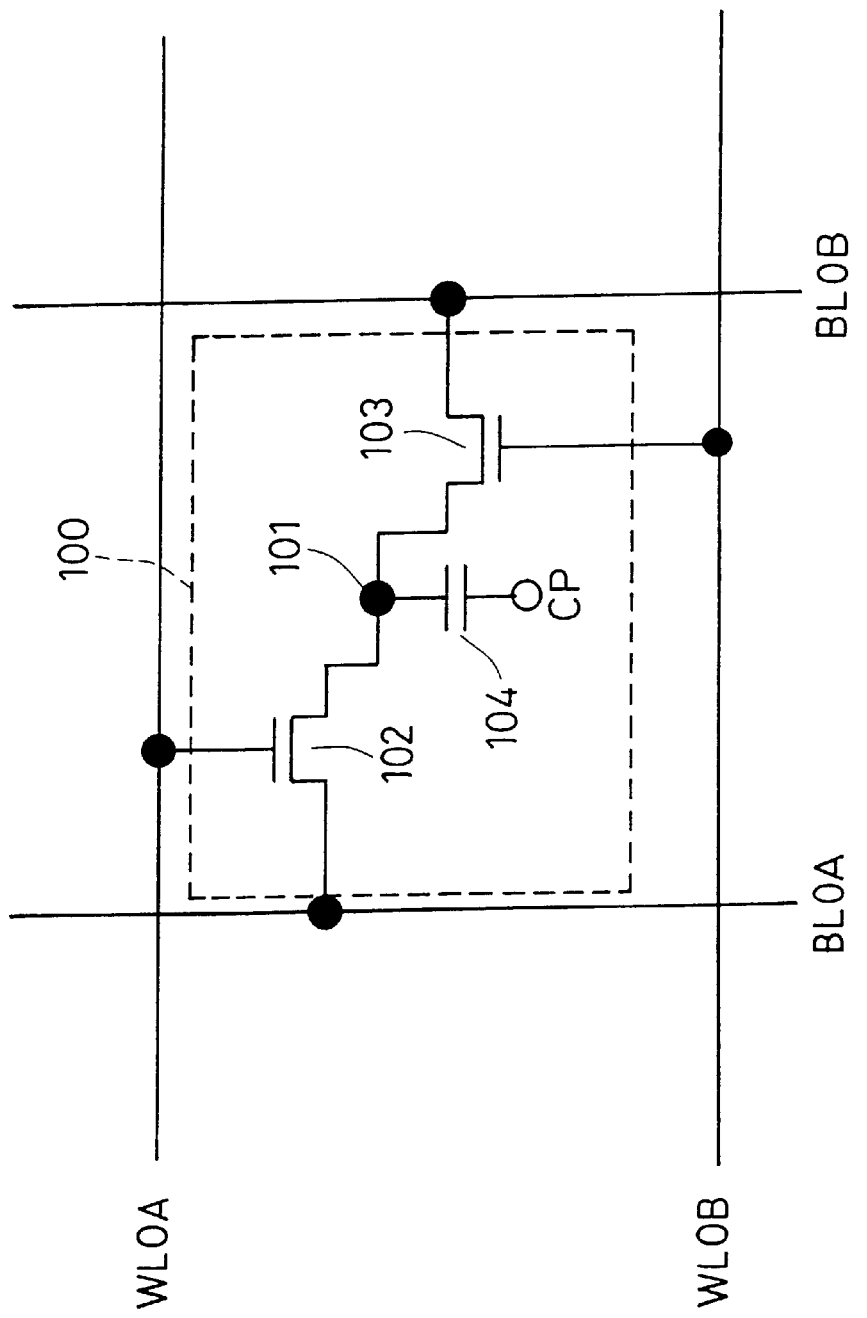
FIG. 1 is a diagram showing the configuration of a 2T/1C memory cell.
Figure 2:
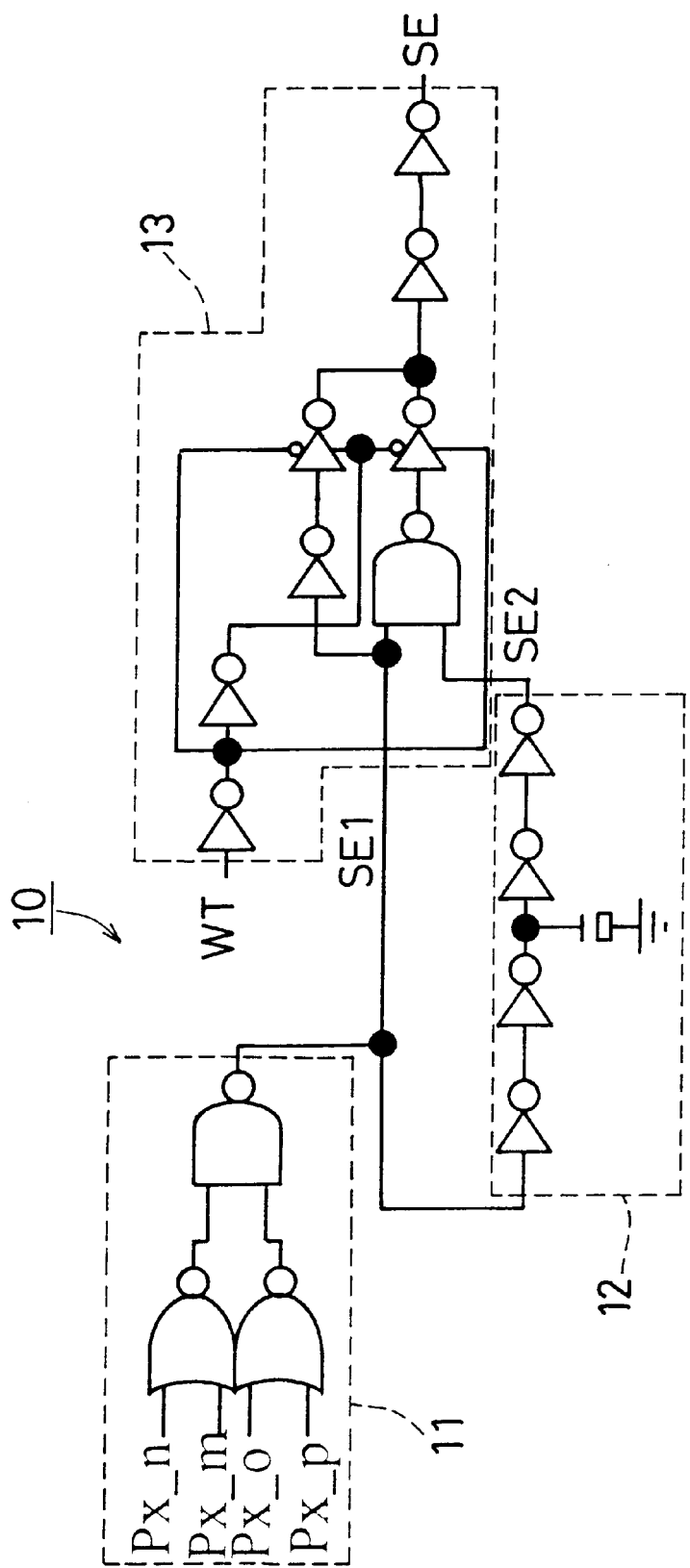
FIG. 2 is a circuit diagram showing the configuration of a sense amplifier starting signal generation circuit 10.

FIG. 2 is a circuit diagram showing the configuration of the sense amplifier starting signal generation circuit 10. In FIG. 2, the sense amplifier starting signal generation circuit 10 includes a decode circuit 11, a delay circuit 12, and a selecting circuit 13 so as to change the timing of a sense amplifier starting signal. The decode circuit 11 decodes pre-decode signals PX_n, PX_m, PX_o and PX_q, which are referred to as "PX". The delay circuit 12 delays an output signal SE1 from the decode circuit 11 by a predetermined time. The selecting circuit 13 selects either the output signal SE 1 from the decode circuit 11 or an output signal SE2 delayed by the delay circuit 12 in response to the write command signal WT generated by a write command.

To change the timing of the sense amplifier starting signal SE, the sense amplifier starting signal generation circuit 10 performs the following operations: when the signal WT is a logic High level, it outputs the output signal SE1 from the decode circuit 11 as the sense amplifier starting signal SE; when the signal WT is a logic Low level, it outputs the output signal SE2 from the delay circuit 12 as the sense amplifier starting signal SE.

Figure 3:
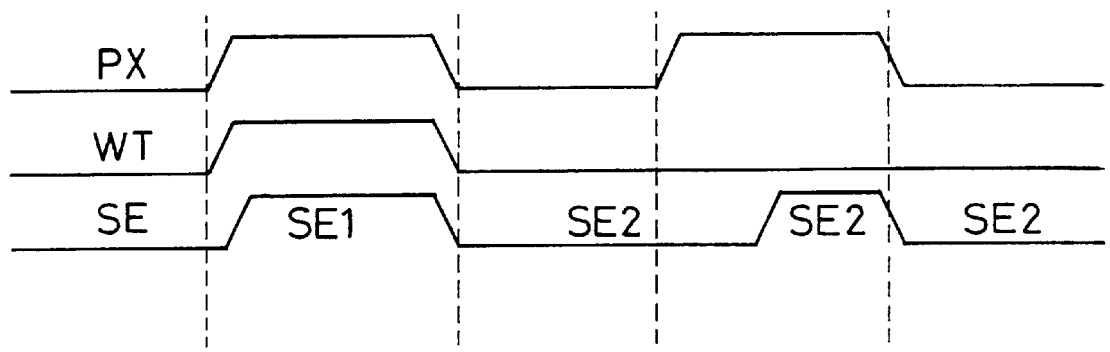
FIG. 3 is a timing chart of signals in the sense amplifier starting signal generation circuit 10 in FIG. 2.

FIG. 3 is a timing chart of a pre-decode signal PX, a write command signal WT, and a sense amplifier starting signal SE in the sense amplifier starting signal generation circuit 10 in FIG. 2.

In FIG. 3, the pre-decode signal PX is generated by an external command, and the write command signal WT is provided at the same time that the signal PX transits from a logic Low level to a logic High level. When the signal WT transits from a logic Low level to a logic High level, the selecting circuit 13 transfers the output signal SE1 of the decode circuit 11 as the sense amplifier starting signal SE. When the signal PX makes a transition from the logic Low to High levels and the signal WT is the logic Low level, the selecting circuit 13 transfers the output signal SE2 of the delay circuit 12 as the sense amplifier starting signal SE.

Figure 10:
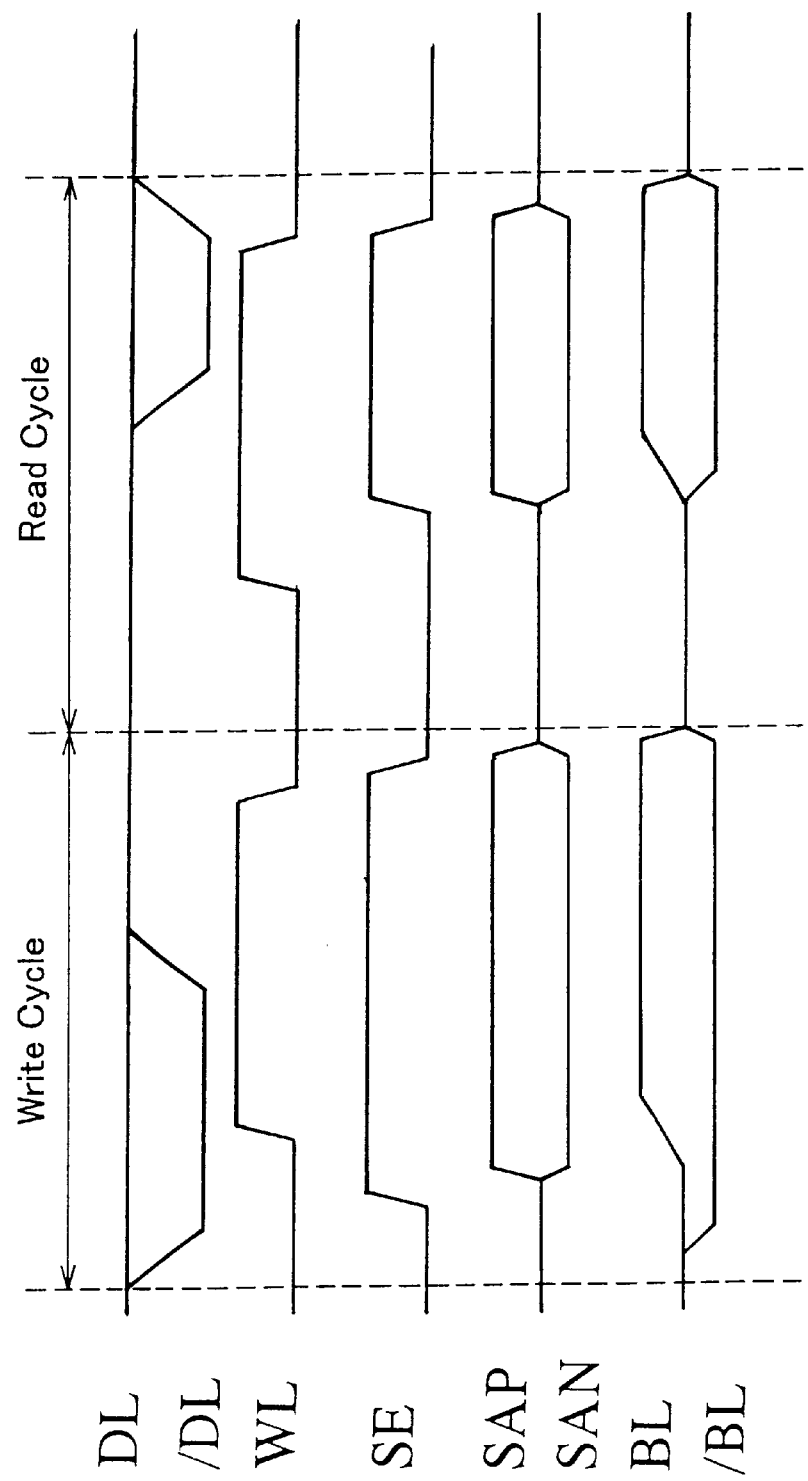
FIG. 10 is a timing chart of signals in the semiconductor memory device in FIG. 9.

By using the sense amplifier starting signal generation circuit 10 in FIG. 2, the sense amplifier starting signal SE is generated at a high speed only for writing, while it is generated after a predetermined time delay for reading or refreshing. This makes it possible to perform a high-speed writing operation and a normal reading or refreshing operation when the entire memory cell array selected is rewritten during the writing operation. In this case, the above function can be achieved by using only the sense amplifier starting signal generation circuit 10 in FIG. 2 even without the sense amplifier driving circuit 20 in FIG. 4. The above function also can be achieved in such a manner that the sense amplifier starting signal generation circuit 10 has a conventional configuration in which delay is not adjusted for writing and reading, and the sense amplifier driving circuit 20 and the decode signals Y, /Y in FIG. 4 are used in the same way as this embodiment to select the entire memory cell array. FIG. 10 is a timing chart of signals for each portion in the semiconductor memory device in FIG. 9.

Figure 11:
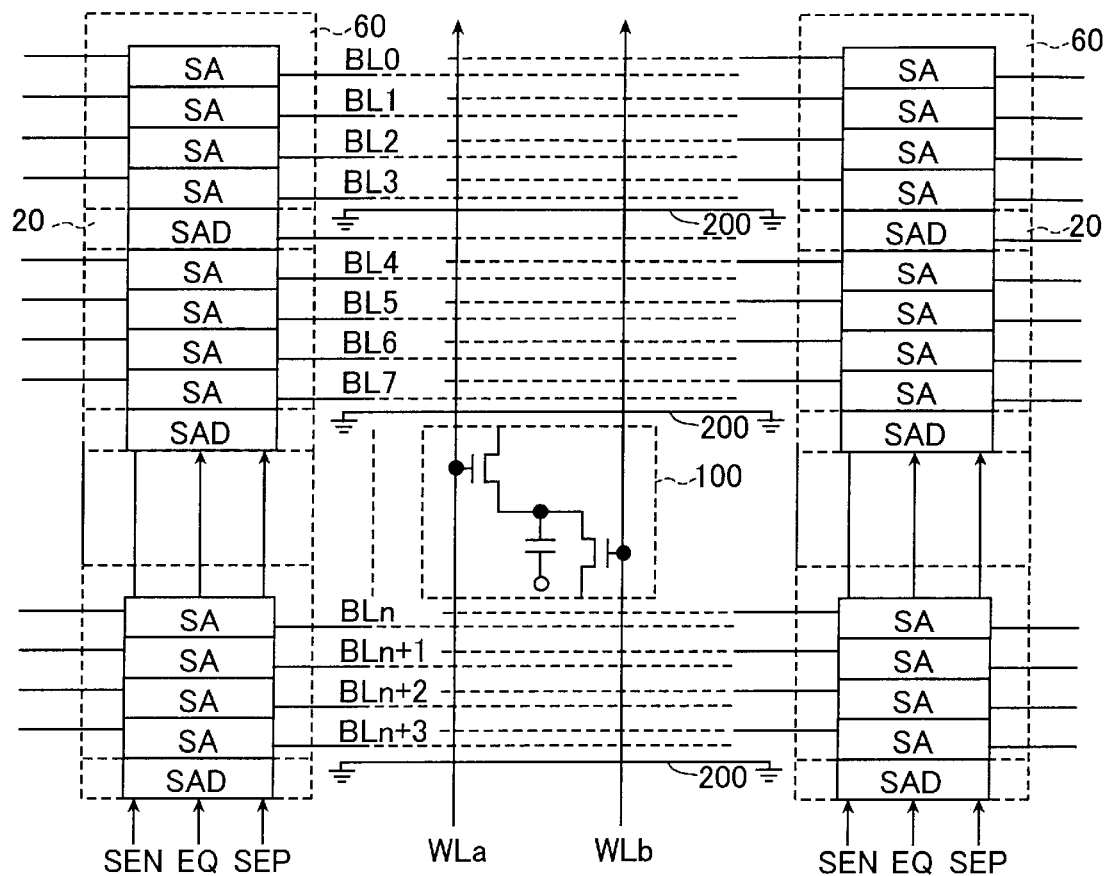
FIG. 11 is a diagram showing a semiconductor memory device with the configuration illustrated in FIG. 6 or FIG. 7, which has the function of dealing with noise.

FIG. 11 shows an example of a semiconductor memory device with the configuration illustrated in FIG. 6 or FIG. 7 that performs a high-speed writing operation and a refreshing operation at the same time. In this example, a bit line to be written is amplified at an earlier time compared with a bit line to perform a refreshing operation. This may cause a charge transfer of the bit line for the refreshing operation to be affected by noise. To solve this problem, metal wires 200 are provided in the bit line direction of a memory cell group so that each metal wire corresponds to the location of a sense amplifier driver 20 (SAD) and is connected to a ground potential.

The metal wires 200 are connected to one selected from the ground potential, a source potential and an internally generated potential. However, the potential can be varied freely depending on the device characteristics.

As described above, the present invention can provide a semiconductor memory device that is capable of reducing a write time required for inversing charge stored in a charge capacitor so as to speed up a random access cycle.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor memory device comprising:
   a memory cell for retaining data by storing charge in a storage capacitor;

a bit line that is connected selectively to the memory cell by activation of a word line;

a sense amplifier connected to the bit line;

an input circuit for receiving an external input; and a sense amplifier driving circuit for generating a driving signal to drive the sense amplifier, wherein the sense amplifier driving circuit activates the driving signal upon receipt of the external input, with a first delay time in writing and with a second delay time in reading, the first delay time being shorter than the second delay time, and wherein write data is transferred to the bit line before activating the driving signal in writing.

2. The semiconductor memory device according to claim 1, further comprising a sense amplifier starting signal generation circuit for generating a sense amplifier starting signal upon receipt of the external input, with a shorter delay time for writing than for reading, wherein the sense amplifier driving circuit operates in response to the sense amplifier starting signal.

3. The semiconductor memory device according to claim 1, wherein the sense amplifier driving circuit generates the driving signal before a selected word line is activated in writing.

4. The semiconductor memory device according to claim 1, wherein the memory cell is a 2T/1C memory cell comprising two switching transistors, each of which is connected to the storage capacitor at one end.

5. A semiconductor memory device comprising:

a memory cell for retaining data by storing charge in a storage capacitor;

a bit line that is connected selectively to the memory cell by activation of a word line;

a sense amplifier connected to the bit line; and a sense amplifier driving circuit for generating a driving signal to drive the sense amplifier, wherein the sense amplifier driving circuit activates the driving signal with timing that differs in writing and reading, and write data is transferred to the bit line before activating the driving signal in writing, wherein the sense amplifier driving circuit generates the driving signal at an earlier time for writing than for reading, and wherein the sense amplifier driving circuit comprises a transistor that activates the driving signal in accordance with a decode signal only in writing.

6. A semiconductor memory device comprising:

a memory cell for retaining data by storing charge in a storage capacitor;

a bit line that is connected selectively to the memory cell by activation of a word line;

a sense amplifier connected to the bit line; and a sense amplifier driving circuit for generating a driving signal to drive the sense amplifier, wherein the sense amplifier driving circuit activates the driving signal with timing that differs in writing and reading, and write data is transferred to the bit line before activating the driving signal in writing, wherein the sense amplifier driving circuit generates the driving signal at an earlier time for writing than for reading, and wherein the device comprises a plurality of sense amplifier driving circuits, each of which generates a driving signal in accordance with a decode signal in writing, and the driving signal that corresponds to a memory cell to be written is generated at an earlier time than that for reading, while the driving signal that corresponds to a memory cell to be refreshed is generated at the same time as that for reading.

7. The semiconductor memory device according to claim 6, wherein the driving signal that corresponds to the memory cell to be written is generated before a selected word line is activated in writing.

8. The semiconductor memory device according to claim 6, wherein a wire is provided in a boundary region between the memory cell to be written and that to be refreshed in writing, the wire having a fixed potential and extending in a bit line direction.

* * * * *